(12) United States Patent
Ide et al.

(10) Patent No.: US 7,317,636 B2
(45) Date of Patent: Jan. 8, 2008

(54) NONVOLATILE SEMICONDUCTOR MEMORY, A DATA WRITE-IN METHOD FOR THE NONVOLATILE SEMICONDUCTOR MEMORY AND A MEMORY CARD

(75) Inventors: Yugo Ide, Yokohama (JP); Kazunori Kanebako, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 11/150,150

(22) Filed: Jun. 13, 2005

(65) Prior Publication Data
US 2005/0276116 A1    Dec. 15, 2005

(30) Foreign Application Priority Data
Jun. 14, 2004    (JP) .............................. 2004-175884

(51) Int. Cl.
*G11C 16/06*    (2006.01)
(52) U.S. Cl. ........................... 365/185.22; 365/185.09; 365/185.28
(58) Field of Classification Search ........... 365/185.22, 365/185.09, 185.28
See application file for complete search history.

(56) References Cited

U.S. PATENT DOCUMENTS

| | | | |
|---|---|---|---|
| 6,507,518 B2 | 1/2003 | Hosono et al. | |
| 6,657,896 B2 | 12/2003 | Hosono et al. | |
| 6,859,401 B2 | 2/2005 | Ikehashi et al. | |
| 6,868,009 B1* | 3/2005 | Hung et al. ............. | 365/185.12 |
| 6,922,366 B2* | 7/2005 | Micheloni et al. ..... | 365/189.07 |
| 2005/0041515 A1* | 2/2005 | Futatsuyama et al. ....... | 365/232 |

FOREIGN PATENT DOCUMENTS

| | | |
|---|---|---|
| JP | 2002-140899 | 5/2002 |
| JP | 2002-216486 | 8/2002 |

* cited by examiner

*Primary Examiner*—Connie C. Yoha
(74) *Attorney, Agent, or Firm*—Oblon, Spivak, McClelland, Maier & Neustadt, P.C.

(57) ABSTRACT

A nonvolatile semiconductor memory includes a memory cell array, a page buffer that is connected to the memory cell array and retains program verification results of a write-in operation of repeating data write-in and program verification, a bit scan circuit that is connected to the page buffer and determines whether or not the number of fail bits is equal to or less than number of reference bits based on the program verification results retained in the page buffer, a register that is connected to the bit scan circuit and retains determination results of the bit scan circuit, and a sequencer that controls the write-in operation and an operating sequence of the bit scan circuit and terminates the write-in operation while leaving the number of fail bits in response to the results temporarily stored in the register.

17 Claims, 11 Drawing Sheets

# NONVOLATILE SEMICONDUCTOR MEMORY, A DATA WRITE-IN METHOD FOR THE NONVOLATILE SEMICONDUCTOR MEMORY AND A MEMORY CARD

CROSS REFERENCE TO RELATED APPLICATIONS AND INCORPORATION BY REFERENCE

This application is based upon and claims the benefit of priority from prior Japanese Patent Application P2004-175884 filed on Jun. 14, 2004; the entire contents of which are incorporated by reference herein.

BACKGROUND OF THE INVENTION

1. Field of the Invention

The present invention relates to a nonvolatile semiconductor memory. More specifically, it relates to a nonvolatile semiconductor memory, a data write-in method for the nonvolatile semiconductor memory and a memory card implementing the nonvolatile semiconductor memory, which suppress program disturbances arising due to an unselected high voltage being applied during a data write-in operation.

2. Description of the Related Art

According to a conventional data write-in method for a NAND flash memory, a program loop for writing data is repeated with an arbitrary step width and is stopped when all bits are written. The arbitrary step width is, for example, approximately 0.2 V for a multi-valued logic nonvolatile semiconductor memory.

A semiconductor memory has been disclosed in Japanese Patent Application Laid-Open No. 2002-140899. The disclosed memory is capable of providing processing results in a short time and includes a detection circuit that not only detects whether all program verification results are acceptable, but also detects the number of high-speed failures. The semiconductor memory, according to Japanese Patent Application Laid-Open No. 2002-140899, detects whether or not memory cells enter a predetermined data retaining state. This detection is possible by passing a predetermined amount of fail current based on whether or not a write-in operation or an erase operation for each memory cell within a collectively processed unit is completed, detecting the total amount of current flowing through that collectively processed unit by an A/D converter, and finally finding the number of predetermined incomplete states developed by collective processing (Japanese Patent Application Laid-Open No. 2002-140899 (e.g., see FIG. 1)).

A multi-valued nonvolatile memory with a simple structure capable of carrying out a highly accurate and high-speed write-in operation has been disclosed in Japanese Patent Application Laid-Open No. 2002-216486 (e.g., see FIG. 9). The multi-valued nonvolatile memory has a simple structure in which each single memory cell is capable of storing at least two bits of data is capable of processing a highly accurate and high-speed write-in operation. This is achieved by gradually increasing the amount of unit write-in data for a multi-valued nonvolatile memory in an erase state from a minimum unit during the first write-in operation, determining write-in characteristics of the memory cell based on the amount of written data permitting a predetermined threshold voltage equal to or less than primary threshold voltages, and deciding the amount of unit write-in data based on the determination results (Japanese Patent Application Laid-Open No. 2002-216486 (e.g., see FIG. 9)).

According to a conventional data write-in method for a NAND flash memory, a write-in loop reaching an upper limit (hereafter, referred to as $Loop_{\_max}$) in a page, which includes a low write-in speed, isolated bit. A problem arises that a program disturbance frequently occurs due to an unselected voltage. In addition, since a write-in loop runs until data is written in all memory cell transistors, or until the $Loop_{\_max}$ in a page, which includes several bits of low write-in speed memory cell transistors, a program disturbance frequently occurs due to an unselected voltage. Furthermore, there is a problem that a program disturbance frequently occurs in all pages of a nonvolatile semiconductor memory including a 'column failure' where '0' is changed to '1' along the bit line length.

In addition, even with a conventional NAND flash memory, setting an upper limit value for a write-in voltage and limiting the write-in voltage below that upper limit value suppresses the influence of a program disturbance, however, there is a problem that write-in yield is adversely affected.

SUMMARY OF THE INVENTION

An aspect of the present invention inheres in a nonvolatile semiconductor memory. The memory includes a memory cell array comprising a plurality of memory cells; a page buffer connected to the memory cell array and that retains program verification results of a write-in operation of repeating data write-in; a bit scan circuit connected to the page buffer and that determines whether or not the number of fail bits is equal to or less than a number of reference bits based on the program verification results retained in the page buffer; a register connected to the bit scan circuit and that retains determination results of the bit scan circuit; and a sequencer that controls the write-in operation and an operating sequence of the bit scan circuit, and terminates the write-in operation while leaving the number of fail bits, in response to the results, temporarily stored in the register.

Another aspect of the present invention inheres in a data write-in method for a nonvolatile semiconductor memory. The method includes determining whether or not a verification status resulting from ignoring the primary specific number of bits is a pass status; determining the status as a pass status if the verification status resulting from ignoring the primary specific number of bits is a pass status; and carrying out a program verification where the primary specific number of bits are ignored if the verification status resulting from ignoring the primary specific number of bits is a fail status.

Another aspect of the present invention inheres in a memory card. The memory card includes a nonvolatile semiconductor memory comprising a memory cell array including a plurality of memory cells; a page buffer connected to the memory cell array and that retains program verification results of a write-in operation of repeating data write-in; a bit scan circuit connected to the page buffer that determines whether or not the number of fail bits is equal to or less than a number of reference bits based on the program verification results retained in the page buffer; a register connected to the bit scan circuit that retains determination results of the bit scan circuit; and a sequencer that controls the write-in operation and an operating sequence of the bit scan circuit, and terminates the write-in operation while leaving the number of fail bits, in response to the results, temporarily stored in the register; and a memory controller comprising: a host interface connected to the nonvolatile semiconductor memory and a host apparatus that receives data from the host apparatus; a memory interface connected to the nonvolatile semiconductor memory that transmits write-in data to the nonvolatile semiconductor memory; a central processing unit, which writes the received data as write-in data in the nonvolatile semiconductor memory via the memory interface; and an ECC circuit connected between the host interface and the memory interface that receives the received data, and carries out error correction.

DETAILED DESCRIPTION OF THE INVENTION

Figure 1:
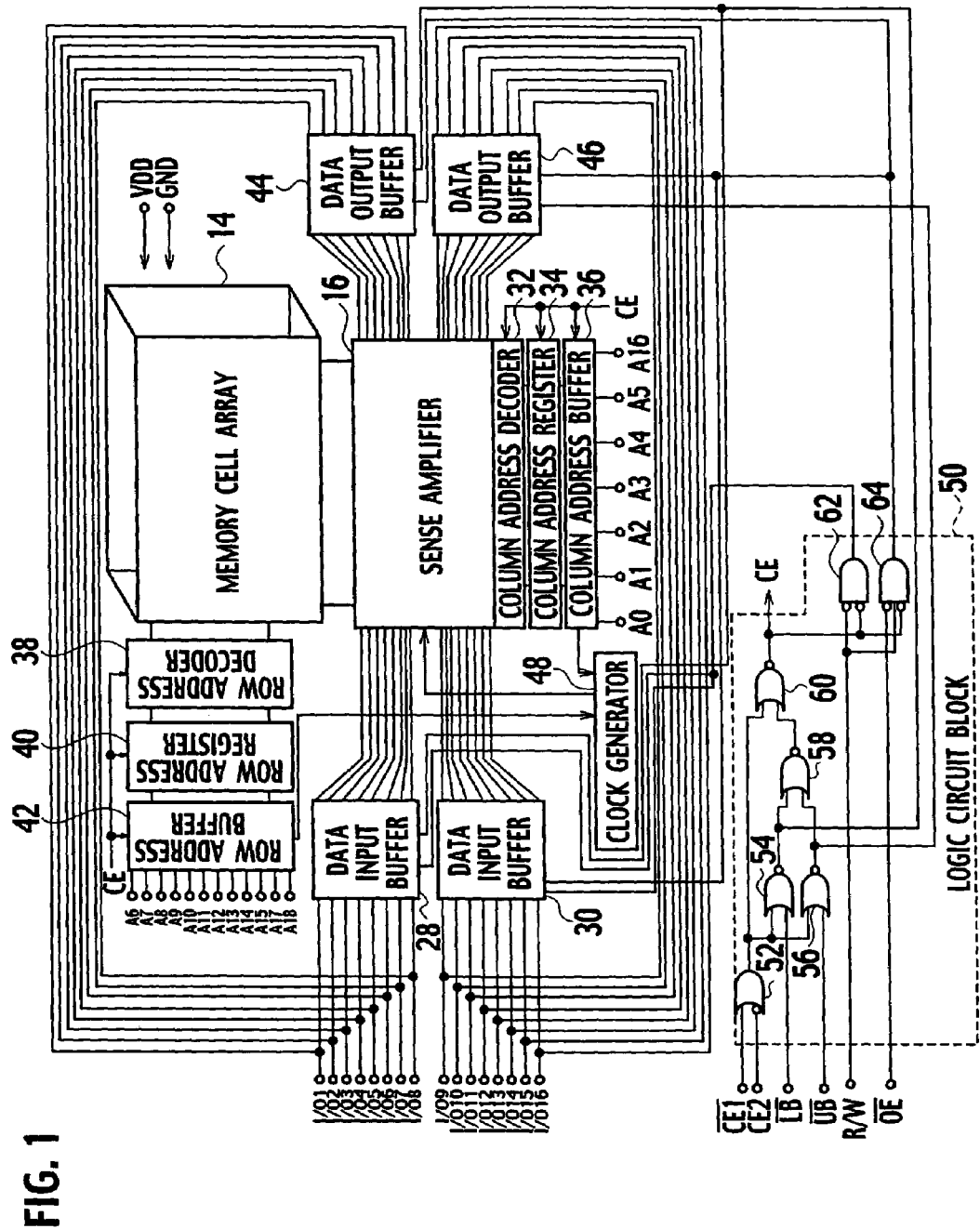
FIG. 1 is an overall schematic block diagram of a nonvolatile semiconductor memory, according to a first embodiment of the present invention.

The first through the third embodiment of the present invention are described while referencing the drawings. The same or similar symbols are given to the same or similar parts throughout the appended drawings. It should be noted that the drawings are merely schematics, that the ratio of respective circuit block planar dimensions, and the like, differ from those of the actual invention. Furthermore, needless to say, parts with differing dimensions and/or differing ratios among the drawings may be included.

According to embodiments of the present invention, a nonvolatile semiconductor memory, a data write-in method for the same and a memory card, which minimizes disturbance of a program, due to an unselected high voltage generated during data write-in operation, even when a low write-in speed isolated bit error and/or a column failure exists, is provided.

According to the embodiments of the present invention, a multi-valued logic NAND flash memory, a data write-in method for the same and a memory card capable of minimization of influences of a program disturb can be provided. This is attained by ignoring a bit during a data write-in operation of multi-valued logic NAND flash memory and thereby halting write-in loop execution even when a low write-in speed isolated bit error and/or a column failure exists.

In addition, according to the embodiments of the present invention, a multi-valued logic nonvolatile semiconductor memory, a data write-in method for the same and a memory card capable of minimizing the influence of a program disturbance can be provided. This result is achieved by halting a write-in loop execution while leaving a number of bits equal to or less than a primary specific number of bits or a secondary specific number of bits (i.e., equal to or less than the number of ECC tolerable bits) in a page including several bits of low data write-in speed memory cell transistors.

First Embodiment

In the following description, a primary specific number of bits is referred to as M1 bits, and a secondary specific number of bits is referred to as M2 bits. In general, there is a principal constraint of M1<M2< number of ECC tolerable bits. An error correcting code (ECC) used for correcting fail bits and outputting the resulting corrected data is needed when a bit is to be ignored. If an inequality: M1<M2< number of ECC tolerable bits is satisfied, then the memory does not include failures; where M1 and M2 are arbitrary values, respectively. The larger the value, the more effectively the suppression of influence of a program disturbance. However, the value needs to be equal to or less than the number of fail bits to be ensured of correction when using ECC.

According to the embodiments of the present invention, a sequencer performs an important operation, such as carrying out bit scan during a write-in operation and terminating the write-in operation if the number of fail bits falls below a specific value. Such operation may be carried out independent of binary or multi-valued logic. In the case of a multi-valued logic, since distance between the threshold voltages is narrow, the multi-valued logic is easily influenced by a program disturbance in a write-in operation. However, use of a nonvolatile semiconductor memory and a data write-in method for the same, according to the embodiments of the present invention, contributes to overcoming such influences.

(Overall Structure)

As shown in FIG. 1, an entire schematic block diagram of the nonvolatile semiconductor memory, according to the first embodiment of the present invention, comprises: a memory cell array 14; a row address buffer 42 from which address data A6 through A18 are sent to the memory cell array 14; a row address register 40 connected to the row address buffer 42; a row address decoder 38; a sense amplifier 16, which detects data from the memory cell array 14; a column address buffer 36 from which address data A0 through A5 and A16 are sent to the sense amplifier 16; a column address register 34 connected to the column address buffer 36; a column address decoder 32; data output buffers 28 and 30 and data output buffers 44 and 46, which are connected to the sense amplifier 16; and a logic circuit block 50. As shown in FIG. 1, the logic circuit block 50 includes an OR gate 52, NOR gates 54, 56, 58, and 60, and AND gates 62 and 64.

With the nonvolatile semiconductor memory according to the first embodiment of the present invention shown in FIG. 1, write-in status information for each bit is needed for integrating a 'bit ignoring' function. Such information is stored in the sense amplifier 16.

Figure 2:
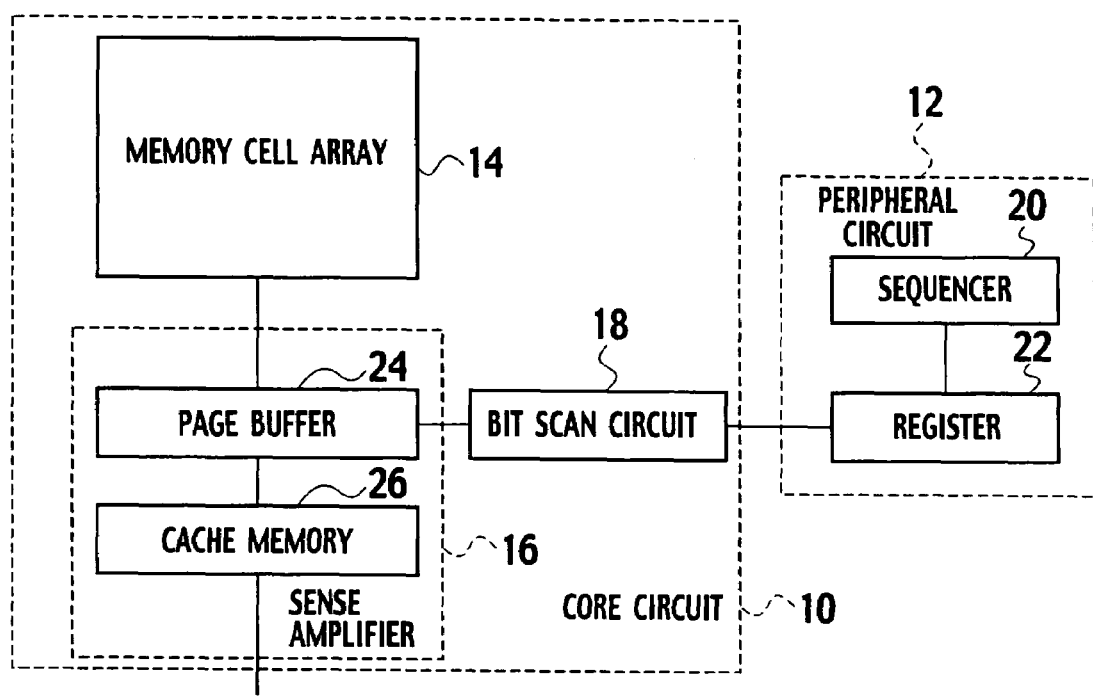
FIG. 2 is a block diagram for describing a characteristic structure of the nonvolatile semiconductor memory, according to the first embodiment of the present invention.

As shown in FIG. 2, a core circuit 10 and a peripheral circuit 12 comprise a block structure of the location of the sense amplifier 16 in the nonvolatile semiconductor memory. The core circuit 10 comprises: the memory cell array 14; the sense amplifier 16, which includes a page buffer 24 and cache memory 26; and a bit scan circuit 18 connected to the page buffer 24. The page buffer 24 retains write-in or read-out data to/from the memory cell array 14 and also retains program verification results during write-in operation. The peripheral circuit 12 comprises a sequencer 20 and a register 22. The bit scan circuit 18 receives data stored in the page buffer 24 within the sense amplifier 16 and then carries out a bit scan operation outside the sense amplifier 16. The register 22 is connected to the bit scan circuit 18, and terminates the write-in operation of the sequencer 20 in response to bit scan results of the bit scan circuit 18.

Accordingly, as shown in FIG. 2, the nonvolatile semiconductor memory, comprises: the memory cell array 14; the page buffer 24 connected to the memory cell array 14 and retains program verification results in the write-in operation of iterating data write-in and program verification; the bit scan circuit 18 connected to the page buffer 24 which determines whether or not the number of fail bits is equal to or less than the number of reference bits, based on program verification results stored in the page buffer 24; the register 22, which retains determination results of the bit scan circuit 18; and the sequencer 20, which controls write-in operation and an operating sequence of the bit scan circuit 18 and terminates the write-in operation, while leaving the number of fail bits, in response to the results temporarily stored in the register 22. Alternatively, the sequencer 20 controls the operating sequence of the bit scan circuit 18, and changes the number of reference bits from M1 bits to M2 bits in the write-in operation. In addition, the memory cell array 14 may store at least ternary multi-valued logic data.

(Sense Amplifier)

Figure 3:
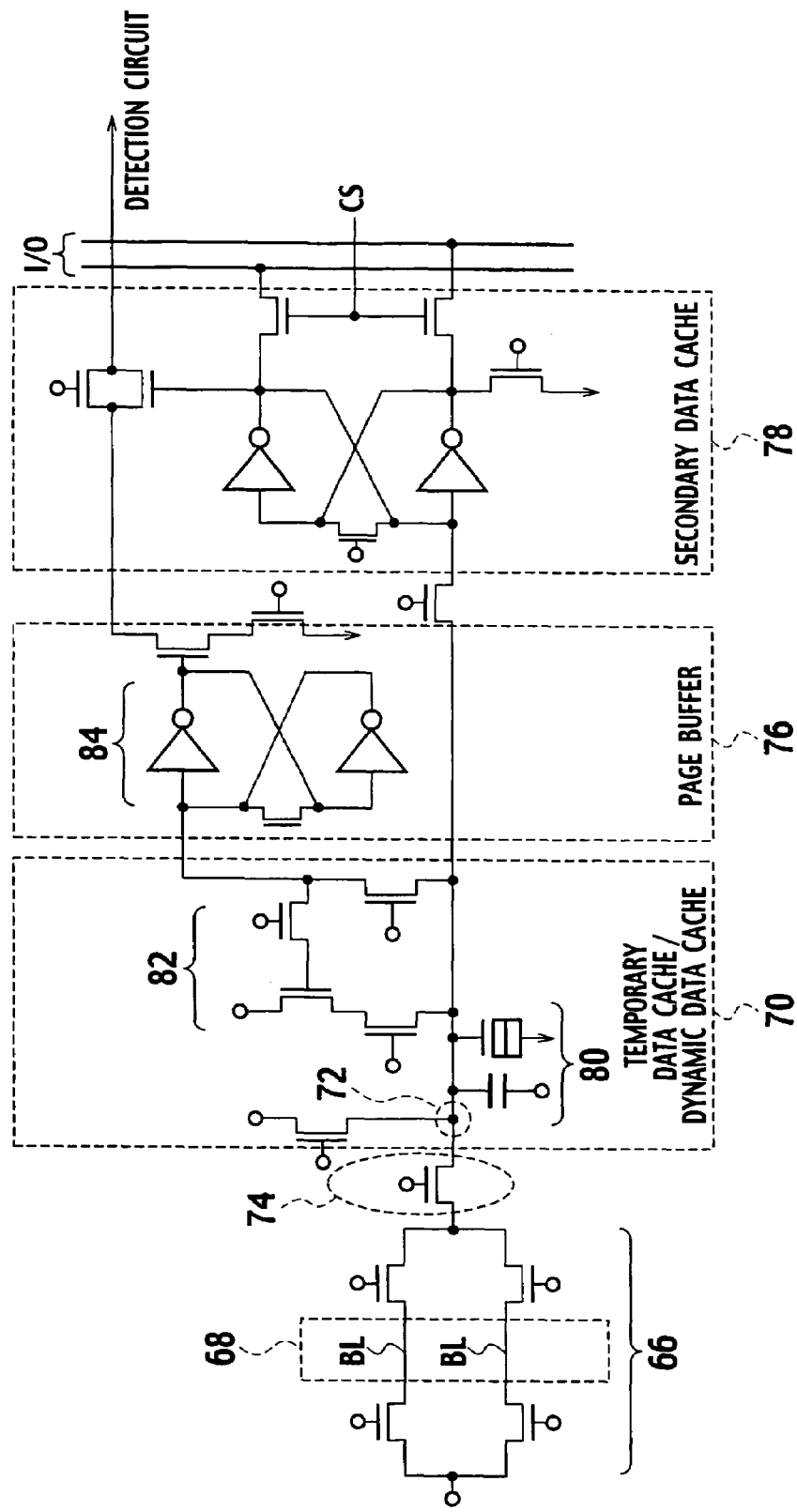
FIG. 3 is a schematic block diagram describing a structure of a sense amplifier used for the nonvolatile semiconductor memory, according to the first embodiment of the present invention.

As shown in FIG. 3, the sense amplifier used for the nonvolatile semiconductor memory, according to the first embodiment of the present invention, comprises: sense amplifier circuits 66 connected to a memory cell array 68 via bit lines BL; a clamp circuit 74; a temporary data cache/dynamic data cache 70 connected to the clamp circuit 74 at a sense node 72; a page buffer 76; and a secondary data cache 78. More specifically, the temporary data cache/dynamic data cache 70 comprises a temporary data cache 80 and a dynamic data cache 82. The page buffer 76 includes a primary data cache 84. The temporary data cache 80 and the dynamic data cache 82 are used for detection and arithmetic operation.

In a read-out operation, the sense node 72 detects the write-in status of memory cell transistors, and stores the results in the primary data cache 84 of the page buffer 76, which has a flip-flop circuit structure. The page buffer 76 corresponds to the page buffer 24 in FIG. 2. The bit scan circuit 18 detects whether the number of fail bits (unwritten bits) is equal to or less than a predetermined number of tolerable bits, based on the data stored in the page buffer 76. A command to terminate write-in operation is given within the sequencer 20, based on the detection result.

(Bit Scan Circuit)

Figure 4A:
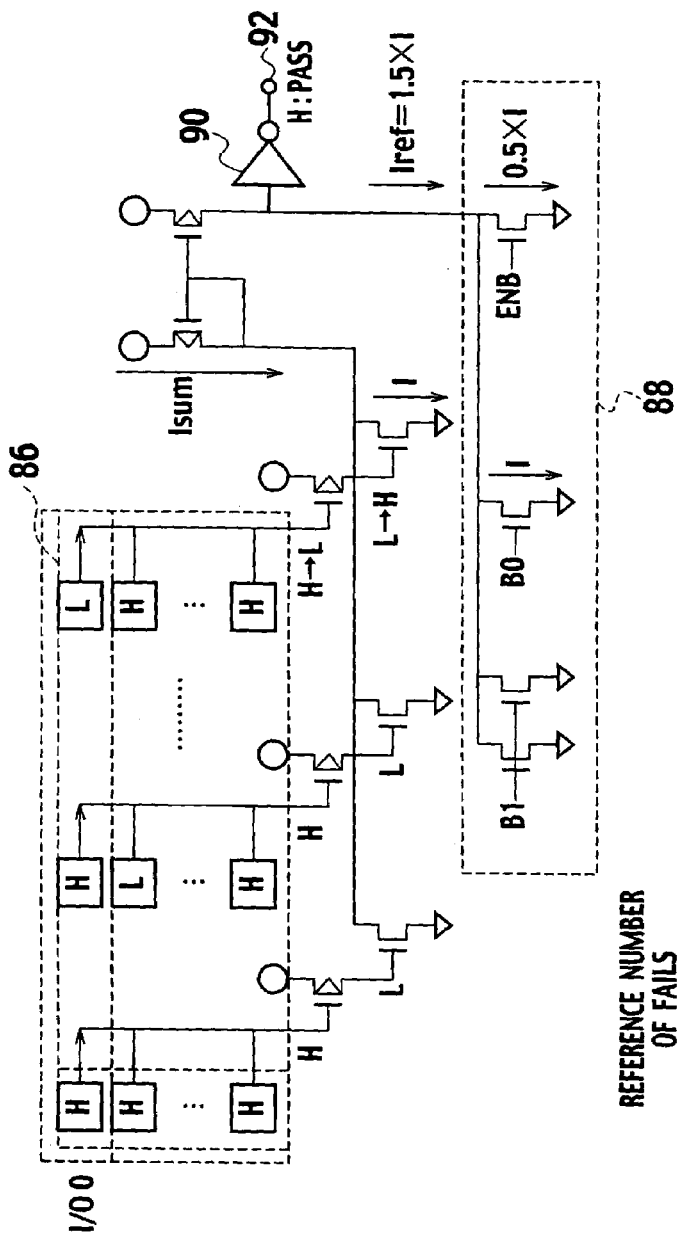
FIG. 4A shows a circuit structure of a bit scan circuit used for the nonvolatile semiconductor memory, according to the first embodiment of the present invention.

As shown in FIG. 4A, the bit scan circuit used for the nonvolatile semiconductor memory, according to the first embodiment of the present invention, comprises: a sense amplifier configured from multiple sense amplifiers (latches) 86 for a single page arranged in parallel; a reference constant current path 88; an inverter 90; and an output node 92. Each of the sense amplifiers included in the respective sense amplifiers (latches) 86 for a single page retains program verification results or pass/fail data. FIG. 4A shows a case where an 'H' level is retained when a program verification result is pass data and an 'L' level is retained when a program verification result is fail data. A differential current between a current $I_{sum}$ from the sense amplifier configured from multiple sense amplifiers (latches) 86 for a single page arranged in parallel, and a reference current $I_{ref}$, which flows through the reference constant current path 88, is detected from the output node 92 of the inverter 90.

Figure 4B:
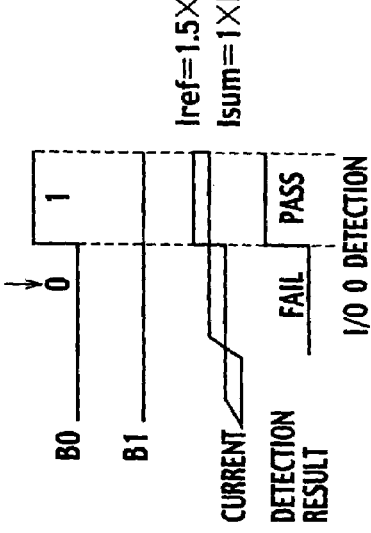
FIG. 4B is a diagram describing operating waveforms of the bit scan circuit used for the nonvolatile semiconductor memory, according to the first embodiment of the present invention.

FIG. 4B shows waveforms of operating current flowing through the circuit in FIG. 4A. Only I/O 0 outputs data from the sense amplifier side. In this case, the current $I_{sum}$ from the sense amplifier is in proportion to the number of pieces of fail data retained in the I/O 0. FIG. 4A shows a case where the number of fail bits in the I/O 0 is a single bit. In this case, the current $I_{sum}$ from the sense amplifier is 1×I. Signals B0 and B1 are supplied to gate pins of MOS transistors within the reference constant current path 88, and levels thereof are specified based on the number of tolerable fail bits (number of reference fail bits). To specify the number of reference fail bits as a single bit, the signals B0 and B1 are set as follows: (B0, B1)=(1, 0). In this case, the reference current $I_{ref}$ is 1.5×I, and thus the current $I_{sum}$ is smaller than the reference current $I_{ref}$. As a result, the output node 92 of the inverter 90 goes to a '1' level. Therefore, it is determined that the number of fail bits in the I/O 0 is equal to or less than the number of tolerable fail bits (a single bit).

With the bit scan circuit, a reference current $I_{ref}$ needs to be specified, based on the number of tolerable bits, and detection needs to be carried out from I/O 0 to I/O 7, respectively.

With the circuit structure of FIG. 4A, since the number of constant current paths is equal to the number of columns, the number of constant current paths corresponds to respective bytes. However, the number of constant current paths is one eighth of the number of bits. Therefore, detection of the number of fail bits for I/O 0 through I/O 7 needs to be carried out by time division eight times. It is determined by increasing the number of tolerable fails one at a time for the reference current $I_{ref}$ that a fail bit is included in I/O 1. In this manner, the number of fail bits can be detected by iterating detection until the I/O 7 and accumulating, in the register 22, the number of fail bits by each I/O. Actually, the operation ends when the total number of fail bits accumulated in the register 22 exceeds a predetermined tolerable value.

This operation may be used when detecting the number of fail bits being equal to or less than a single bit by verification after software program execution for a multi-valued operation, or when detecting the number of fail bits being equal to or less than a single bit after the last write-in loop execution for a multi-valued operation.

(Data Write-In Method)

In the following description, Loop means a loop operation such as repeatedly gradually stepping up the voltage of a write-in pulse. Program count (PC) indicates a Loop execution count obtained by counting every Loop execution and storing the resulting count in a circuit for every Loop execution.

(Study Example)

Figure 5:
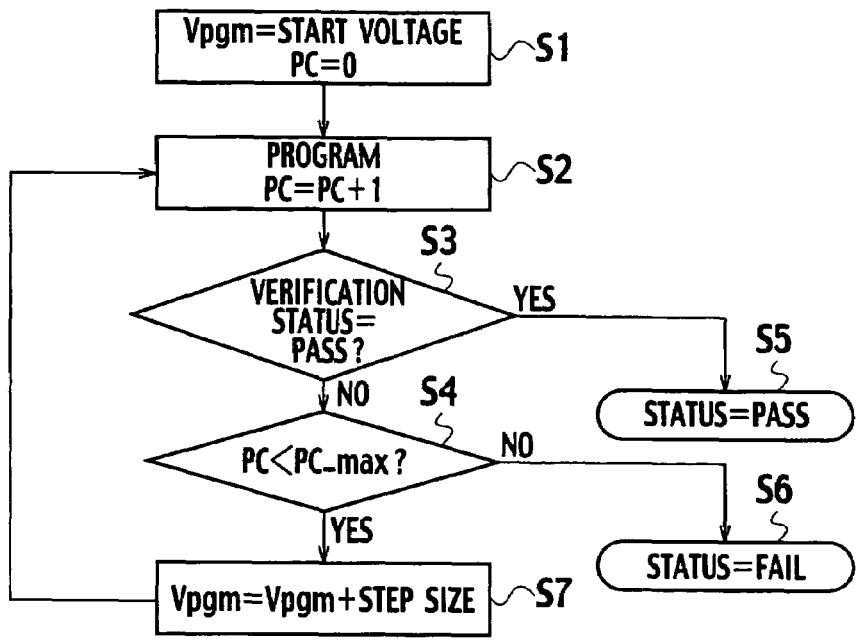
FIG. 5 is a flowchart describing a data write-in method for a nonvolatile semiconductor memory of a study example of the present invention.

A flowchart of FIG. 5 shows a data write-in method for a nonvolatile semiconductor memory, according to a study example for the embodiments of the present invention. $V_{pgm}$ denotes a write-in voltage, and PC denotes a write-in loop execution count.

In step S1, the write-in voltage $V_{pgm}$ is specified to be equal to a start voltage $V_{pgm\_start}$, and the write-in loop execution count PC is initialized to 0.

Next, in step S2, the PC is incremented by one.

Next, in step S3, it is determined whether or not verification status result is pass.

If Yes in step S3, the process proceeds to step S5, and the status result is pass.

If No in step S3, the process proceeds to step S4 in which it is then determined whether or not the write-in loop execution count PC is less than the maximum value $PC_{\_max}$ of the write-in loop execution count.

If No in step S4, the process proceeds to step S6, and the status result is fail.

If Yes in step S4, the process proceeds to step S7 in which the write-in voltage $V_{pgm}$ is then specified to be $V_{pgm}$+step size. Afterwards, the process returns to step S2. As shown in FIG. 5, the NAND flash memory uses a data write-in method of running a program loop with an arbitrary step width during a data write-in operation and halting a write-in loop upon completion of write-in for all bits.

Figure 6:
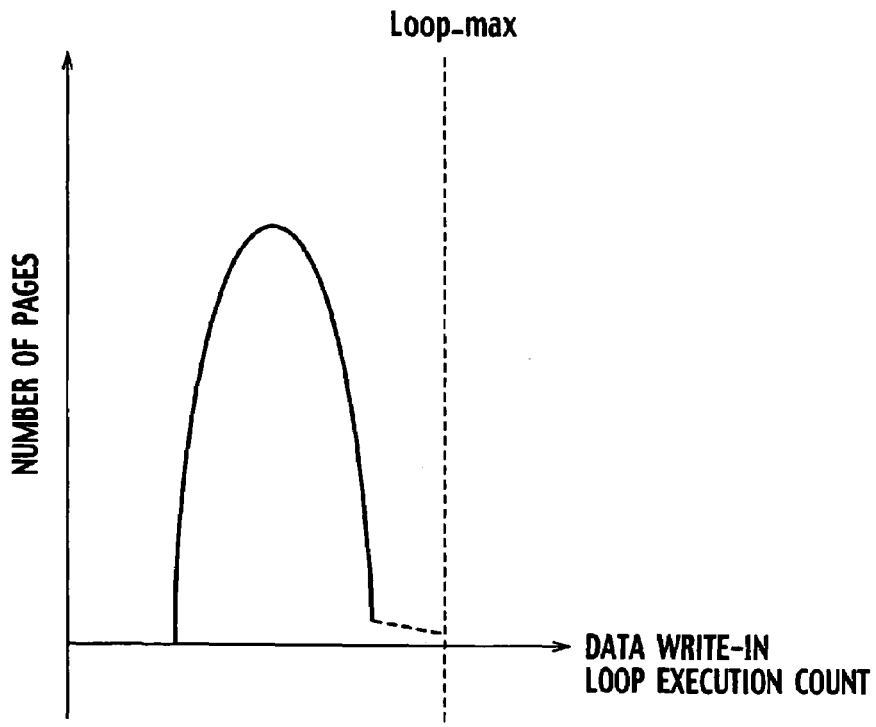
FIG. 6 is a diagram describing a relationship between the number of pages and data write-in loop execution count according to the data write-in method for the nonvolatile semiconductor memory of the study example of the present invention.

The arbitrary step width is, for example, approximately 0.2 V for a multi-valued nonvolatile semiconductor memory. According to the data write-in method for the nonvolatile semiconductor memory of the study example, each page has 512 bytes writable by increasing a voltage applied on a word line. The relationship between the distribution of the number of pages and the write-in loop execution counts is shown in FIG. 6.

(Data Write-In Method According to Embodiments of the Present Invention)

Figure 7:
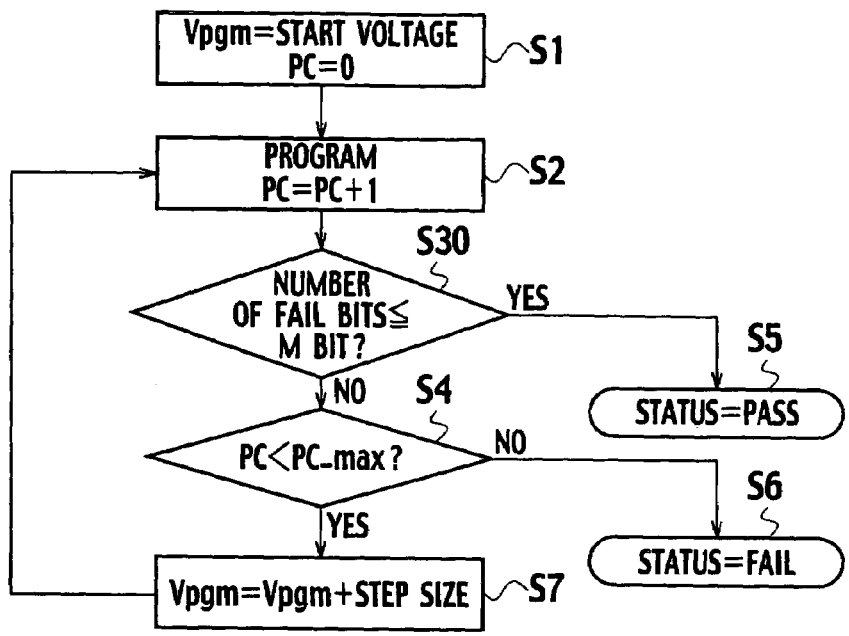
FIG. 7 is a flowchart describing a data write-in method for a non-volatile semiconductor memory according to the embodiments of the present invention.
Figure 8:
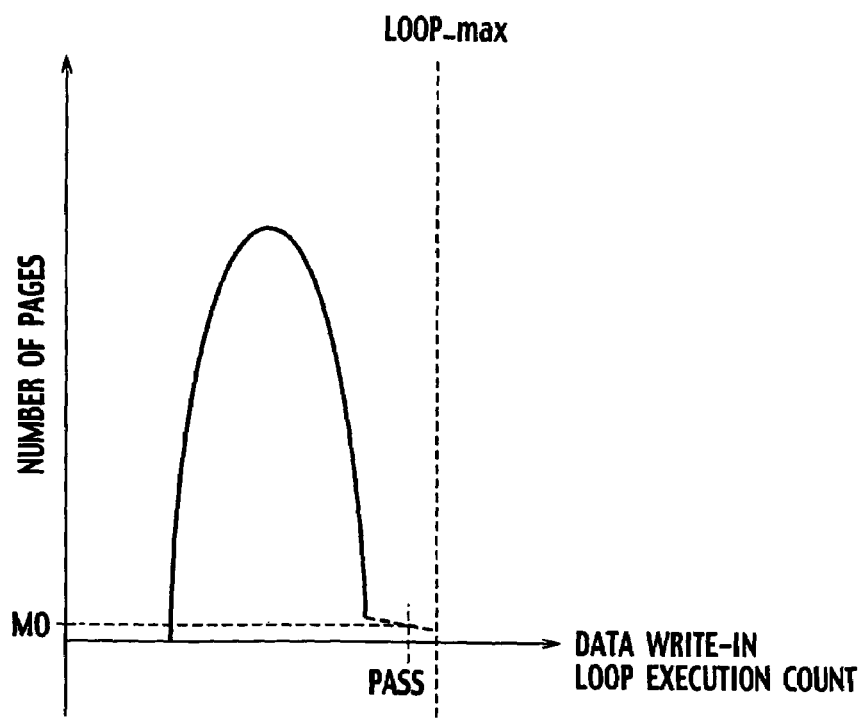
FIG. 8 is a diagram for describing a relationship between the number of pages and the data write-in loop execution count according to the data write-in method for the nonvolatile semiconductor memory of the embodiments of the present invention.

FIG. 7 is a flowchart describing a data write-in method for a non-volatile semiconductor memory according to the embodiments of the present invention. FIG. 8 is a diagram for describing a relationship between the number of pages and the data write-in loop execution count.

The data write-in method for a non-volatile semiconductor memory is described forthwith while referencing FIG. 7. It is assumed that V pgm denotes a write-in voltage and PC denotes a write-in loop execution count.

First, in step S1, the write-in voltage $V_{pgm}$ is specified to be equal to a start voltage $V_{pgm\_start}$, and the write-in loop execution count PC is initialized to 0.

Next, in step S2, the PC is incremented by one.

Next, in step S30, it is determined whether or not the number of fail bits is equal to or less than M bits.

If Yes in step S30, the process proceeds to step S5, and the status result is pass.

If No in step S30, the process proceeds to step S4 in which it is then determined whether or not the write-in loop execution count PC is less than the maximum value $PC_{\_max}$ of the write-in loop execution count.

If No in step S4, the process proceeds to step S6, and the status result is fail.

If Yes in step S4, the process proceeds to step S7 in which the write-in voltage $V_{pgm}$ is then specified to be $V_{pgm}$+step size. Afterwards, the process returns to step S2.

As shown in FIG. 7, the NAND flash memory uses a data write-in method of running a program loop with an arbitrary step width during a data write-in operation and halting a write-in loop upon completion of write-in of all bits.

The arbitrary step width is, for example, approximately 0.2 V for a multi-valued nonvolatile semiconductor memory. According to the data write-in method for the nonvolatile semiconductor memory of the embodiments of the present invention, each page includes 512 bytes that are writable by increasing a voltage applied on a word line. The relationship between the distribution of the number of pages and the write-in loop execution counts is shown in FIG. 8.

According to the data write-in method for a nonvolatile semiconductor memory of the embodiments of the present invention, as is apparent from FIGS. 7 and 8, the data write-in loop execution count may be specified to be a PASS value in response to the number of pages M0.

The following embodiments are intended for a NAND flash memory assuming that an error correcting code (ECC) circuit is used.

A write-in loop runs from the start of a data write-in operation to the N-th loop execution (hereafter, referred to as $Loop_{\_max2}$) while ignoring M1 bits, and program verification (write-in status verification) is carried out for every loop execution from the N+1-th loop execution to $Loop_{\_max}$, where M2 bits are ignored (see FIG. 9); where, M1 and M2 are arbitrary values, respectively, and there is a relationship: M1<M2< number of ECC tolerable bits.

Figure 10:
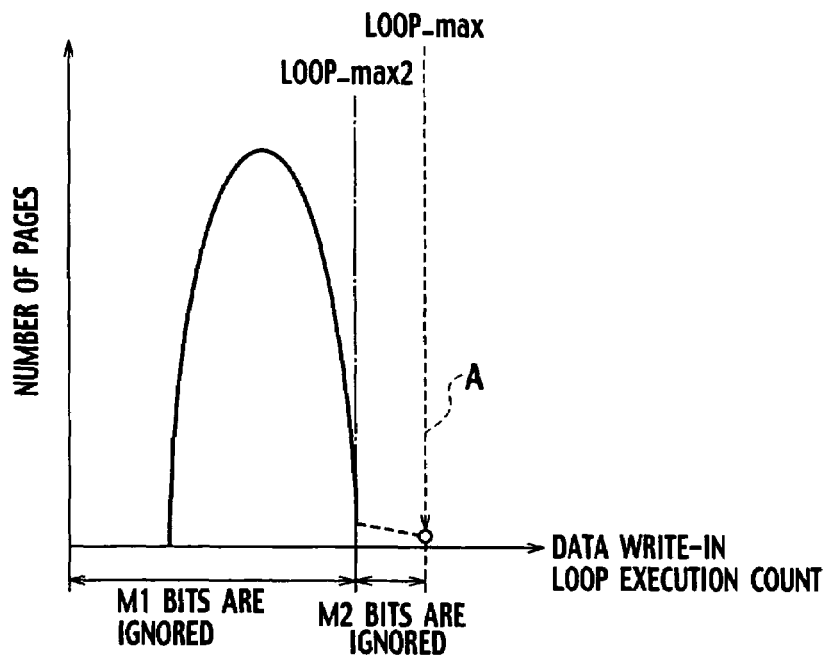
FIG. 10 is a diagram describing a relationship between the number of pages and data write-in loop execution count according to the data write-in method for the nonvolatile semiconductor memory of the first embodiment of the present invention.

FIG. 10 shows a distribution of the number of pages over program loop execution counts. As shown in the drawing, a value at or near the boundary that accommodates all typical pages is arbitrarily specified as $Loop_{\_max2}$. Note that it is desirable that the value of $Loop_{\_max2}$ be designed so that trimming is possible considering write-in instability of each nonvolatile semiconductor memory.

According to the nonvolatile semiconductor memory of the first embodiment of the present invention, Loop$_{\_max2}$ is a variable specified as an arbitrary fixed loop execution count from the start of write-in operation, and differs for respective nonvolatile semiconductor memory chips. The 'start of write-in operation as a variable' means that the write-in start voltage V$_{pgm\_start}$ differs for respective nonvolatile semiconductor memory wafer chips. 'Start of write-in operation as a variable' is carried out by measuring an optimal write-in start voltage V$_{pgm}$ start for each chip and writing the resulting measured value within the chip in advance. In addition, 'arbitrary fixed loop execution count' is a value arbitrarily determined by a device designer or a circuit designer.

Figure 9:
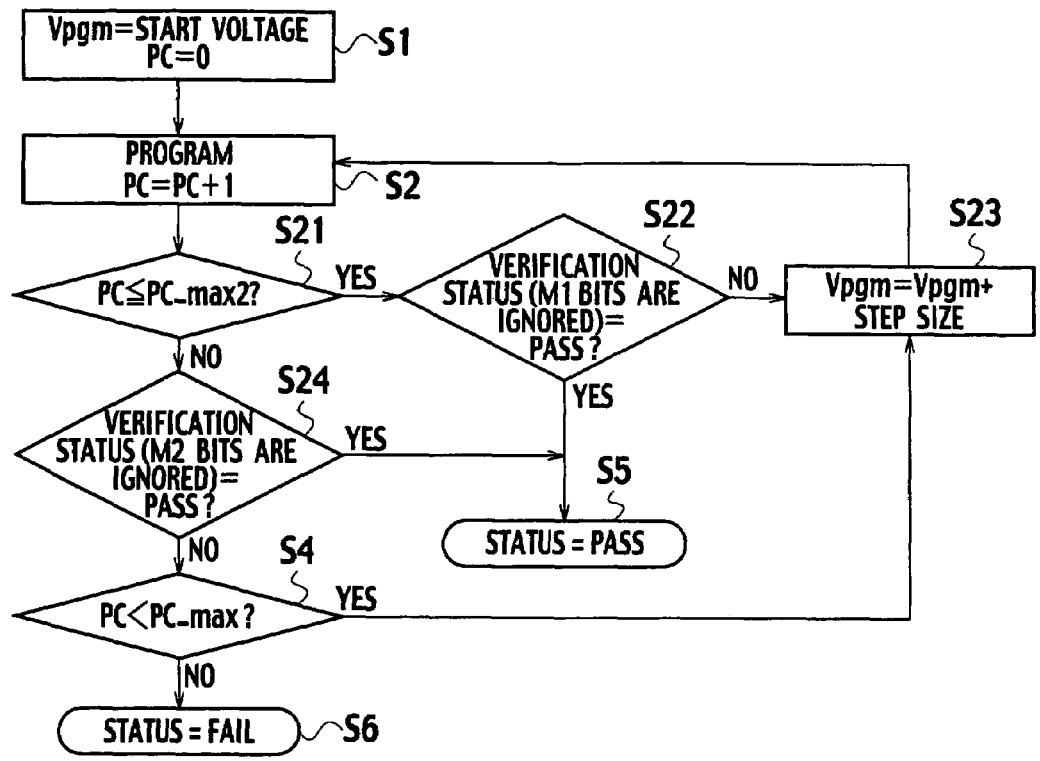
FIG. 9 is a flowchart describing a data write-in method for the nonvolatile semiconductor memory, according to the first embodiment of the present invention.

FIG. 9 is a flowchart describing a data write-in method for the nonvolatile semiconductor memory, according to the first embodiment of the present invention.

First, in step S1, the write-in voltage V$_{pgm}$ is specified to be equal to a start voltage V$_{pgm}$ start, and the write-in loop execution count PC is initialized to 0.

Next, in step S2, the PC is incremented by one.

In step S21, it is determined whether or not the write-in loop execution count PC≦the upper limit value PC$_{\_max2}$ of the write-in loop execution count.

If Yes in step S21, the process proceeds to step S22 in which it is then determined whether or not verification status resulting from ignoring M1 bits is pass.

If No in step S21, the process proceeds to step S24 in which it is then determined whether or not verification status resulting from ignoring M2 bits is pass.

If Yes in step S22, the process proceeds to step S5, and the status result is pass.

If No in step S22, the process proceeds to step S23, the write-in voltage V$_{pgm}$ is then specified to be equal to V$_{pgm}$+step size. Afterwards, the process returns to step S2.

If Yes in step S24, the process proceeds to step S5 in which the status then result is pass.

If No in step S24, the process proceeds to step S4 in which it is then determined whether or not the write-in loop execution count PC is less than the maximum value PC max thereof.

If Yes in step S4, the process returns to step S23.

If No in step S4, the process proceeds to step S6 in which the status then results in fail.

FIG. 10 shows the relationship between the number of pages and data write-in loop execution count according to the data write-in method for the nonvolatile semiconductor memory of the first embodiment of the present invention.

Figure 11:
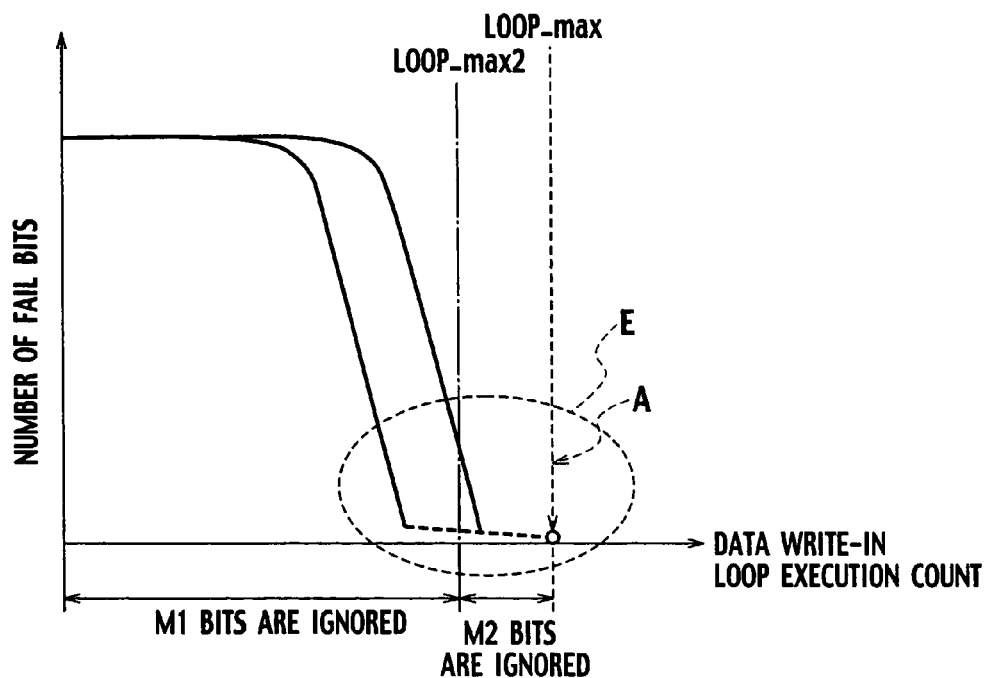
FIG. 11 is a diagram describing a relationship between the number of fail bits and data write-in loop execution count according to the data write-in method for the nonvolatile semiconductor memory of the first embodiment of the present invention.

FIG. 11 shows the relationship between the number of fail bits and data write-in loop execution count according to the data write-in method for the nonvolatile semiconductor memory of the first embodiment of the present invention.

Figure 12:
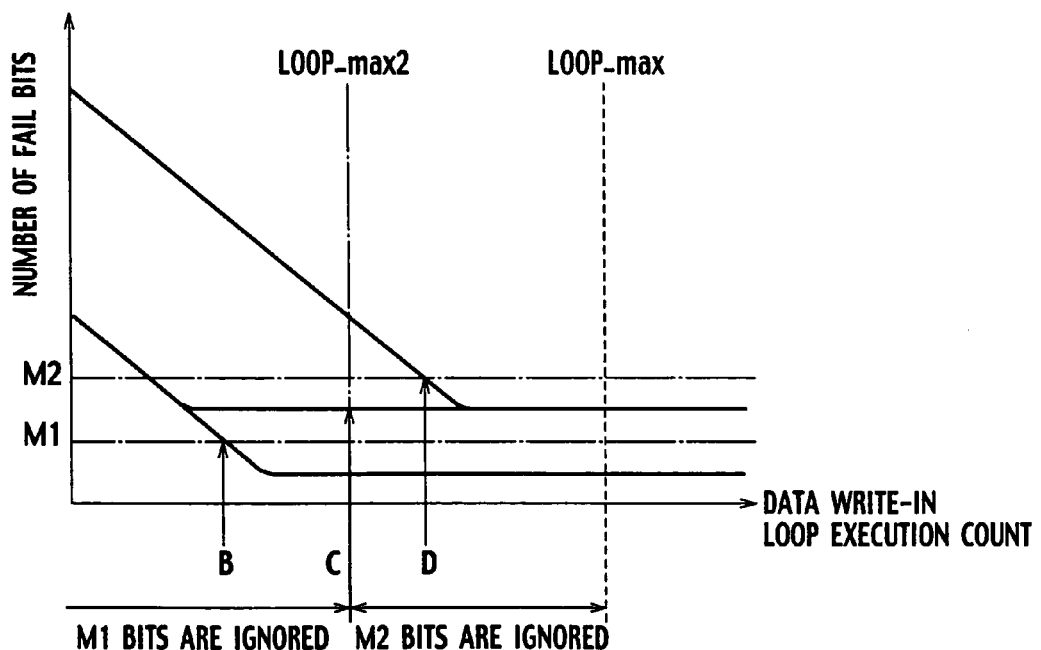
FIG. 12 is a diagram describing a relationship between the number of fail bits and data write-in loop execution count according to the data write-in method for the nonvolatile semiconductor memory of the first embodiment of the present invention.

FIG. 12 is a magnified diagram of the relationship between the number of fail bits and data write-in loop execution count.

FIG. 10 shows exemplary page cell write-in characteristics in which Loop$_{\_max}$ is nearly reached as shown by A in the drawing.

FIG. 10 shows a representative distribution of high cell write-in speed pages and low cell write-in speed pages, where the horizontal axis indicates the data write-in loop execution count and the vertical axis indicates the number of unwritten data bits. As shown in FIG. 10, according to the write-in method of the study example, when there are several bits of low write-in speed memory cell transistors, the write-in loop runs until Loop$_{\_max}$ (shown by A in FIG. 11) where data is written in all cells. On the other hand, according to the data write-in method of the nonvolatile semiconductor memory of the first embodiment of the present invention, the loop execution halts without writing-in bits below the M1 and the M2 bits. This process minimizes the influence of a program disturbance.

FIG. 12 is a magnified diagram of distributions at and near Loop$_{\_max2}$ and Loop$_{\_max}$, and exemplifies points B, C, and D at which write-in operation is halted by ignoring the M1 and M2 bits.

As described above, a page including an isolated bit error and/or a column failure and having a distribution of write-in loop execution counts effectively suppresses the influence of a program disturbance.

Exemplary parameters are suggested below.

(1) Loop 1 through Loop 28: no bit is ignored.

(2) Loop 29 through Loop 32 (Max): a single bit is ignored.

Ignoring a single bit after the 29-th loop execution causes the write-in loop execution to ignore a single bit, write, and then halt, even when there is a low write-in speed isolated bit error and/or a column failure as described above.

In addition, if a single bit is ignored from the start of write-in operation, the write-in loop execution halts with a bit left in many pages even in the case of a normal nonvolatile semiconductor memory. However, since there is a remedy for this case by using ECC, ignoring M1 (≧1) bits for a nonvolatile semiconductor memory having a high program disturbance failure rate may be considered.

The nonvolatile semiconductor memory and the data write-in method for the same, according to the first embodiment of the present invention, uses a bit ignoring function that allows termination of write-in loop execution, even when there is a low write-in speed isolated bit error and/or a column failure, and minimizes the influence of program disturbance during a data write-in operation of a multi-valued logic NAND flash memory.

In addition, according to the nonvolatile semiconductor memory and the data write-in method of the first embodiment of the present invention, terminating the write-in loop execution, while leaving a number of bits equal to or less than M1 bits or M2 bits (i.e., equal to or less than the number of ECC tolerable bits), minimizes the influence of a program disturbance in a page including several bits of low data write-in speed memory cell transistors.

Second Embodiment

Figure 13:
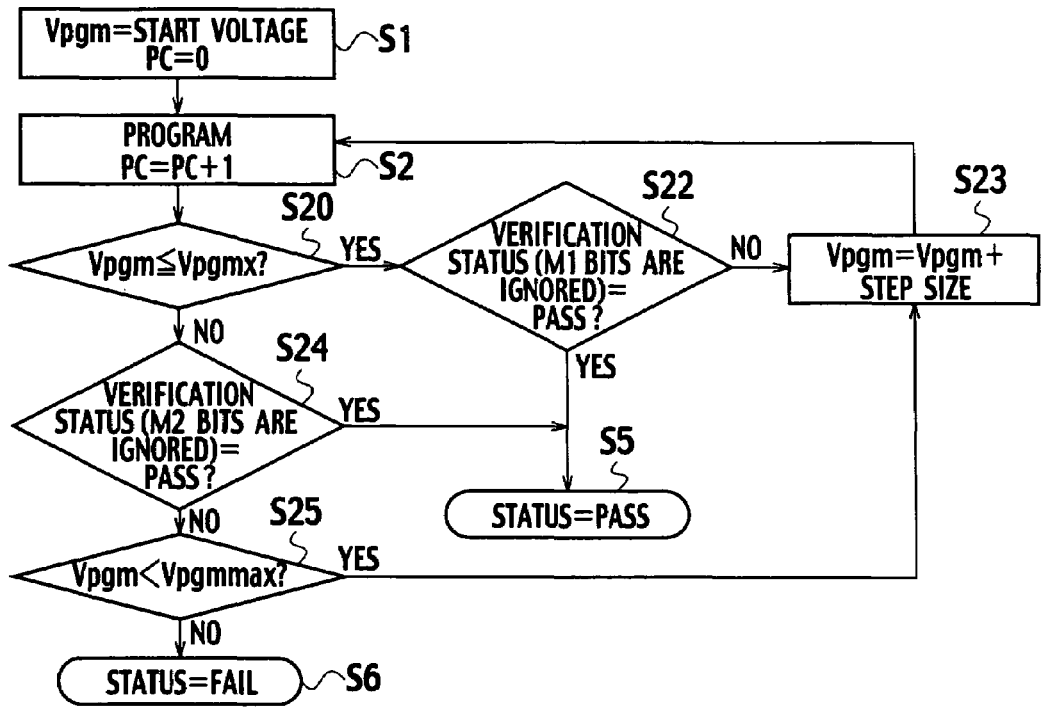
FIG. 13 is a flowchart describing a data write-in method for a nonvolatile semiconductor memory, according to a second embodiment of the present invention.

FIG. 13 is a flowchart describing a data write-in method for a nonvolatile semiconductor memory, according to the second embodiment of the present invention.

According to the first embodiment, bit ignoring parameters are specified based on the data write-in loop execution count. On the other hand, according to the second embodiment, V$_{pgmx}$=V$_{pgm\_start}$+V$_x$ (<V$_{pgm\_max}$) is given for the write-in start voltage (referred to as V$_{pgm\_start}$). The loop runs ignoring M1 bit from the start of write-in operation until Vpgmx, and afterwards ignoring M2 bit until Vpgm-max. Bit ignoring parameters are specified in voltages such that the same advantages as those in the first embodiment are achieved.

According to the nonvolatile semiconductor memory of the second embodiment of the present invention, Loop$_{\_max2}$ is specified to be equal to a specified value V$_{pgmx}$ which is the sum of the write-in start voltage V$_{pgm\_start}$ and an arbitrary fixed voltage V$_x$ as a variable, and differs for respective nonvolatile semiconductor memory chips.

In step S1, the write-in voltage $V_{pgm}$ is specified to be equal to a start voltage $V_{pgm\_start}$, and the write-in loop execution count PC is initialized to 0.

In step S2, the PC is incremented by one.

In step S20, it is determined whether or not the write-in voltage $V_{pgm}$ is equal to or less than the specified value $V_{pgmx}$ which is the sum of the write-in start voltage $V_{pgm\_start}$ and the fixed arbitrary voltage as a variable; where there is a constraint: $V_{pgmx}=V_{pgm\_start}+V_x$ ($<V_{pgmmax}$).

If Yes in step S21, the process proceeds to step S22 in which it is then determined whether or not verification status resulting from ignoring M1 bits is pass.

If No in step S21, the process proceeds to step S24 in which it is then determined whether or not verification status resulting from ignoring M2 bits is pass.

If Yes in step S22, the process proceeds to step S5 in which the status then results in pass.

If No in step S22, the process proceeds to step S23 in which the write-in voltage $V_{pgm}$ is then specified to be $V_{pgm}$+step size. Afterwards, the process returns to step S2.

If Yes in step S24, the process proceeds to step S5 in which the status then results in pass.

If No in step S24, the process proceeds to step S25 in which it is then determined whether or not the relationship: the write-in voltage $V_{pgm} \leq$ the maximum value $V_{pgmmax}$ for the write-in voltage is satisfied.

If Yes in step S25, the process returns to step S23.

If No in step S25, the process proceeds to step S6 in which the status then results in fail.

As described above, according to the nonvolatile semiconductor memory and the data write-in method for the same, according to the second embodiment of the present invention, integration of a bit ignoring function during a data write-in operation of a multi-valued logic NAND flash memory terminates write-in loop execution, even when there is a low write-in speed isolated bit error and/or a column failure, and minimizes the influence of a program disturbance.

In addition, according to the nonvolatile semiconductor memory and the data write-in method for the same of the second embodiment of the present invention, termination of the write-in loop execution, while leaving a number of bits equal to or less than M1 bits or M2 bits (i.e., equal to or less than the number of ECC tolerable bits), minimizes the influence of a program disturbance in a page including several bits of low data write-in speed memory cell transistors.

Third Embodiment

Figure 14:
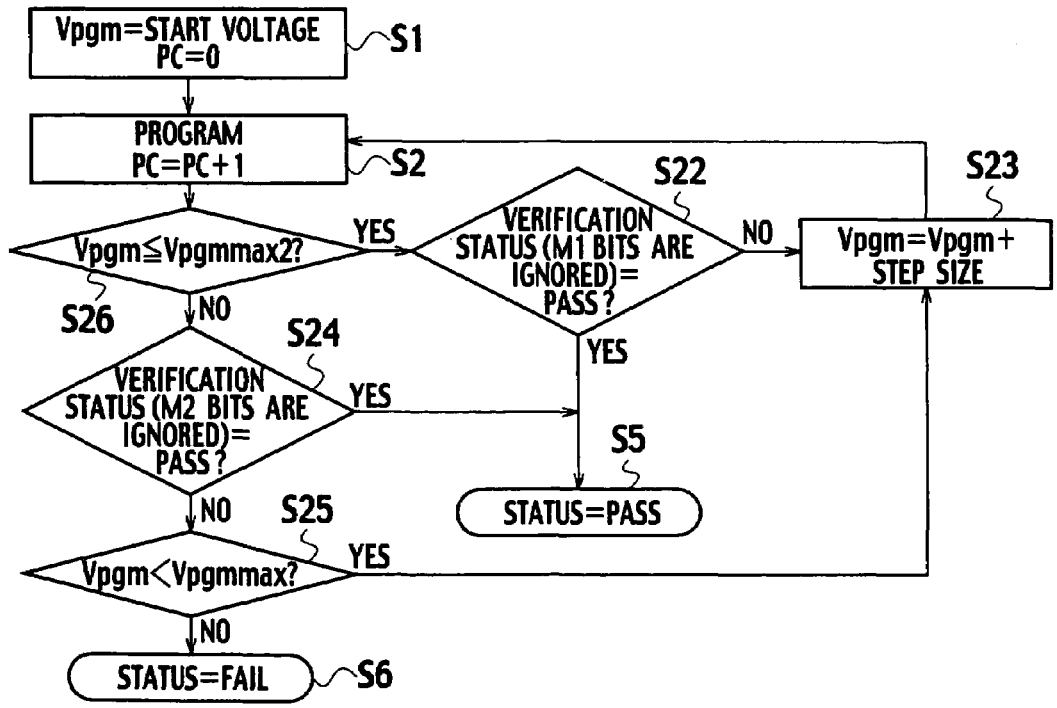
FIG. 14 is a flowchart describing a data write-in method for a nonvolatile semiconductor memory, according to a third embodiment of the present invention.

FIG. 14 is a flowchart describing a data write-in method for a nonvolatile semiconductor memory, according to the third embodiment of the present invention.

The upper limit value $V_{pgmmax2}$ for write-in voltage (<the maximum value $V_{pgmmax}$ for write-in voltage) is specified as a fixed parameter, the loop runs from the start of data write-in operation until $V_{pgmmax2}$ is reached, while ignoring M1 bits. Thereafter, program verification, where M2 bits are ignored, is carried out for each loop execution. Since the upper limit value $V_{pgmmax2}$ for write-in voltage is specified regardless of the write-in start voltage, the advantages of the third embodiment are less than those of the first and the second embodiment if the write-in characteristics widely vary.

With the nonvolatile semiconductor memory according to the third embodiment of the present invention, $Loop_{\_max2}$ is specified to be equal to an arbitrary fixed voltage for all chips.

In step S1, the write-in voltage $V_{pgm}$ is specified to be equal to a start voltage $V_{pgm\_start}$, and the write-in loop execution count PC is initialized to 0.

In step S2, the PC is incremented by one.

In step S26, it is determined whether or not the relationship: write-in voltage $V_{pgm} \leq$ upper limit value $V_{pgmmax2}$ for the write-in voltage is satisfied.

If Yes in step S26, the process proceeds to step S22 in which it is then determined whether or not verification status resulting from ignoring M1 bits is pass.

If No in step S26, the process proceeds to step S24 in which it is then determined whether or not verification status resulting from ignoring M2 bits is pass.

If Yes in step S22, the process proceeds to step S5 in which the status then results in pass.

If No in step S22, the process proceeds to step S23 in which the write-in voltage $V_{pgm}$ is then specified to be $V_{pgm}$+step size. Afterwards, the process returns to step S2.

If Yes in step S24, the process proceeds to step S5 in which the status then results in pass.

If No in step S24, the process proceeds to step S25 in which it is then determined whether or not the relationship: write-in voltage $V_{pgm} \leq$ maximum value $V_{pgmmax}$ for the write-in voltage is satisfied.

If Yes in step S25, the process returns to step S23.

If No in step S25, the process proceeds to step S6 in which the status then results in fail.

As described above, according to the nonvolatile semiconductor memory and the data write-in method for the same of the third embodiment of the present invention, integration of a bit ignoring function during a data write-in operation of multi-valued logic NAND flash memory terminates write-in loop execution, even when there is a low write-in speed isolated bit error and/or a column failure, and minimizes the influence of a program disturbance.

In addition, according to the nonvolatile semiconductor memory and the data write-in method for the same, termination of the write-in loop execution, while leaving a number of bits equal to or less than M1 bits or M2 bits (i.e., equal to or less than the number of ECC tolerable bits) minimizes the influence of a program disturbance in a page including several bits of low data write-in speed memory cell transistors.

(Fail Bit Scan)

Figure 15:
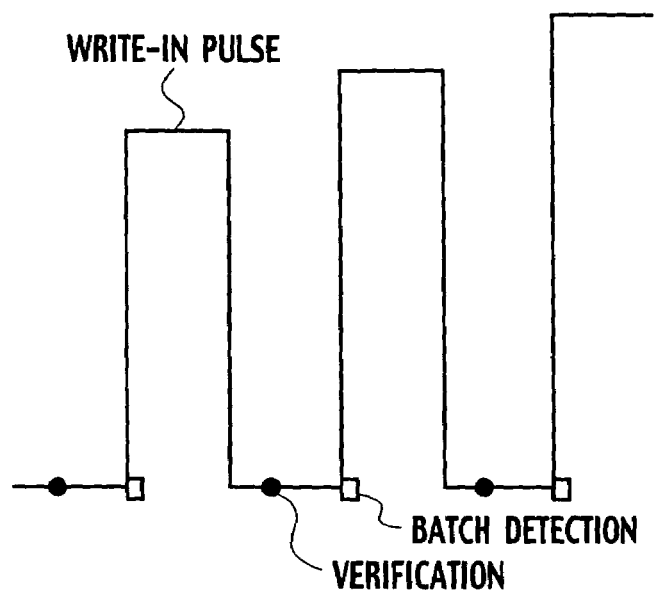
FIG. 15 shows a pulse waveform for describing an exemplary multi-level cell (MLC), which carries out fail bit scan and ignores a single bit only after the last loop execution and then carries out batch detection while applying write-in pulse in other write-in operations according to the data write-in method for the nonvolatile semiconductor memory of the study example of the present invention.
Figure 16:
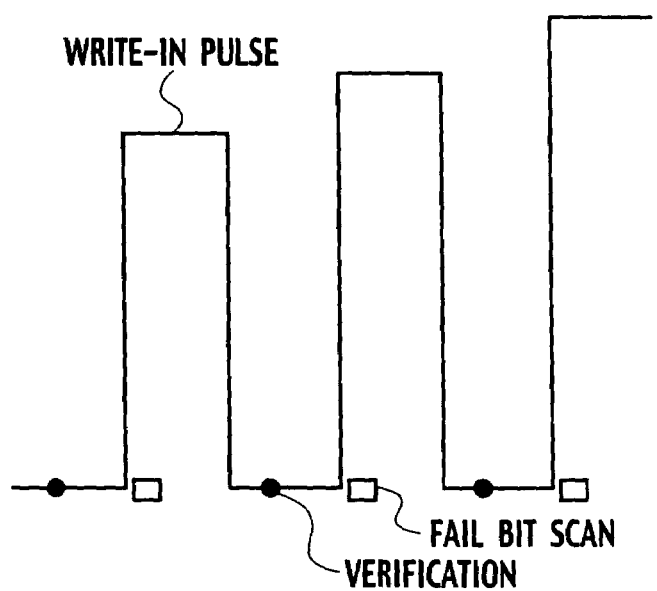
FIG. 16 is a pulse waveform for describing an exemplary multi-level cell (MLC), which carries out fail bit scan upon application of a write-in pulse instead of batch detection according to the data write-in method for the nonvolatile semiconductor memory of the embodiments of the present invention.

FIG. 15 shows a pulse waveform for describing an exemplary multi-level cell (MLC), which carries out a fail bit scan only after the last loop execution, while ignoring a single bit, and carries out batch detection when applying a write-in pulse during other write-in operations using the data write-in method for the nonvolatile semiconductor memory, according to the study example of the present invention. On the other hand, FIG. 16 shows a pulse waveform for describing an exemplary multi-level cell (MLC), which carries out a fail bit scan when applying a write-in pulse, instead of batch detection using the data write-in method for the nonvolatile semiconductor memory, according to the embodiments of the present invention.

(Batch Detection, Fail Bit Scan)

Multi-Level Cell (MLC)

In the case of a multi-level cell (MLC), fail bit scan is carried out only after the last loop execution ignoring a single bit. Batch detection is carried out during other write-in operations. However, batch detection is carried out when applying the write-in pulse as shown in FIG. 15, since batch detection takes longer than the binary operation.

As shown in FIG. 16, according to the write-in method for the nonvolatile semiconductor memory of the embodiments of the present invention, fail bit scan needs to be carried out instead of batch detection, and it is desirable that fail bit scan is carried out when applying a write-in pulse as with the case of using binary values.

[Exemplary Application]

(Memory Card)

Figure 17:
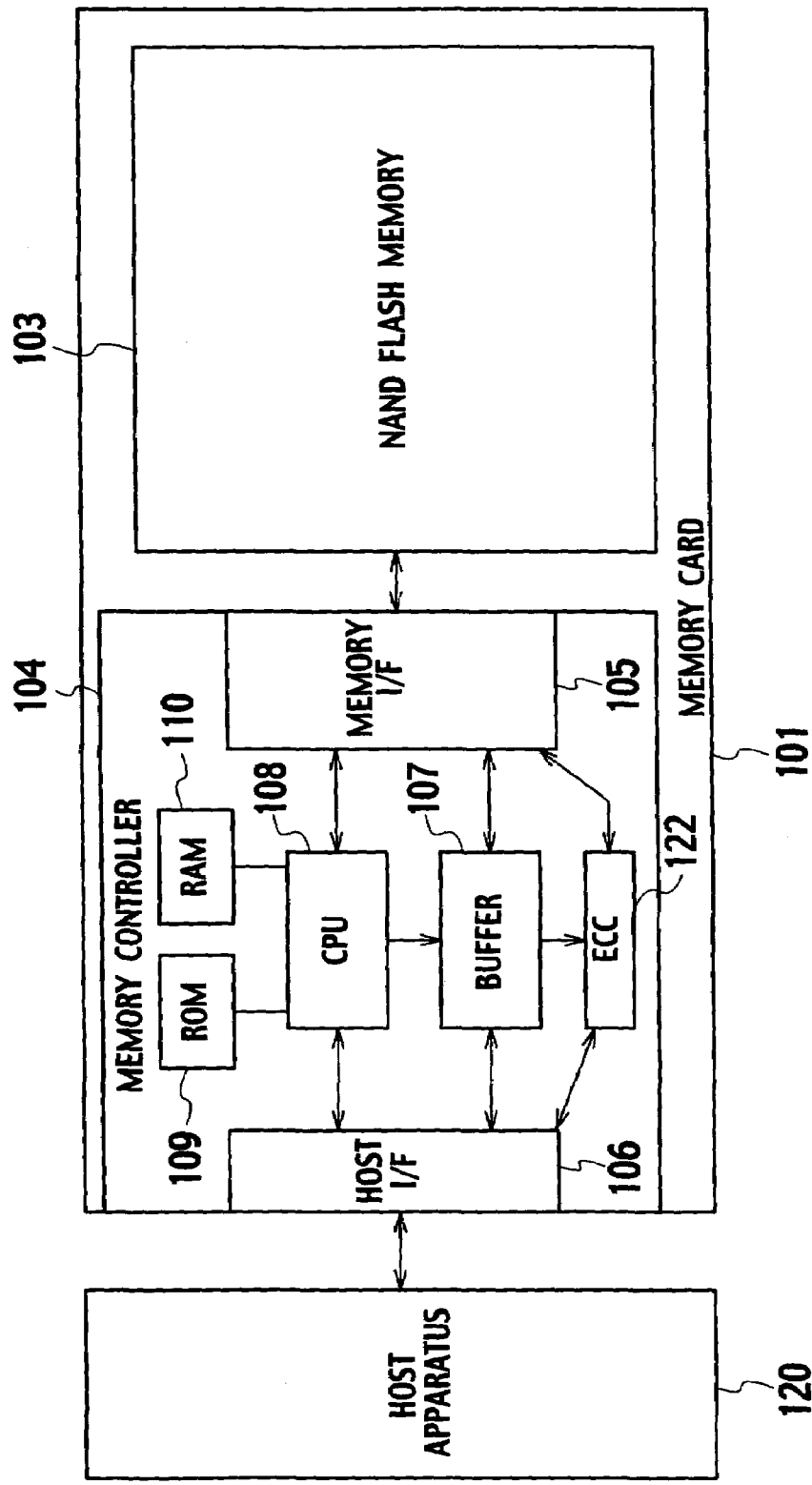
FIG. 17 shows an exemplary structure of a memory card in which a non-volatile semiconductor memory according to the embodiments of the present invention is used.

FIG. 17 shows an exemplary application of a non-volatile semiconductor memory (NAND FLASH MEMORY 103) in a memory card 101, according to the first to the third embodiment of the present invention. A host apparatus 120 comprises hardware and software (system) that allows access to the memory card 101.

The memory card 101 comprises a memory controller 104 and NAND flash memory 103 that is energized once connected to the host apparatus 120, and operates in response to an access from the host apparatus 120.

The memory controller 104, as shown in FIG. 17, comprises a host interface 106 connected to the host apparatus 120 and receives data from the host apparatus 120, a memory-interface 105 connected to the NAND flash memory 103, an ECC circuit 122 connected between the host interface 106 and the memory interface 105 to execute an ECC operation, a buffer circuit 107 that stores the received data, a central processing unit (CPU) 108, and ROM 109 and RAM 110, which are connected to the CPU 108.

The CPU 108 writes the received data as write-in data in the ECC circuit 122 via the host interface 106, reads out from the ECC circuit 122 the data received by the host interface 106 as write-in data, and then writes the read-out data in the NAND flash memory 103 via the memory interface 105.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art.

In this manner, the present invention naturally includes various embodiments not described herein. Accordingly, the technical scope of the present invention is defined by only the claims that appear appropriate from the above explanation.

Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A nonvolatile semiconductor memory comprising:
    a memory cell array comprising a plurality of memory cells;
    a page buffer connected to the memory cell array and which retains program verification results of a write-in operation of repeating data write-in and program verification;
    a bit scan circuit connected to the page buffer to determine whether a number of fail bits is equal to or less than a number of reference bits, based on the program verification results retained in the page buffer;
    a register connected to the bit scan circuit and which retains determination results of the bit scan circuit; and
    a sequencer that controls the write-in operation and an operating sequence of the bit scan circuit, and which terminates the write-in operation while leaving the number of fail bits, in response to the results, temporarily stored in the register.

2. The nonvolatile semiconductor memory of claim 1, wherein the sequencer changes the number of reference bits to a secondary specific number of bits from a primary specific number of bits in the write-in operation.

3. The nonvolatile semiconductor memory of claim 1, wherein the memory cells are configured to store at least ternary multi-valued logic data.

4. The nonvolatile semiconductor memory of claim 2, wherein the memory cells are configured to store at least ternary multi-valued logic data.

5. The nonvolatile semiconductor memory of claim 2, wherein the primary specific number of bits is less than the secondary specific number of bits.

6. The nonvolatile semiconductor memory of claim 2, wherein the primary specific number of bits and the secondary specific number of bits is less than an ECC tolerable number, respectively.

7. The nonvolatile semiconductor memory of claim 5, wherein the secondary specific number of bits is less than an ECC tolerable number.

8. A data write-in method for a nonvolatile memory comprising:
    determining whether a verification status resulting from ignoring a primary specific number of bits for all of data write-in loops is a pass status;
    determining whether a verification status resulting from ignoring a secondary specific number of bits greater than the primary specific number of bits for all of the data write-in loops is a pass status;
    stopping a data write-in operation when the verification status resulting from ignoring the primary specific number of bits for all of the data write-in loops is a fail status;
    determining whether a write-in loop execution count is equal to or less than an upper limit value;
    determining whether a verification status resulting from ignoring the primary specific number of bits is a pass status when the write-in loop execution count is equal to or less than the upper limit value;
    determining whether a verification status resulting from ignoring the secondary specific number of bits greater than the primary specific number of bits is a pass status when the write-in loop execution count is greater than the upper limit value;
    determining whether the write-in loop execution count is smaller than the maximum value when the verification status resulting from ignoring the secondary specific number of bits is a fail status; and
    determining the status as a fail status when the write-in loop execution count is equal to the maximum value;
    wherein program verification, where the primary specific number of bits is ignored, is carried out at the beginning of a data write-in operation until the upper limit value is reached; and program verification, where the secondary specific number of bits is ignored, is carried out when the write-in voltage falls between the upper limit value and the maximum value.

9. A data write-in method for a nonvolatile memory comprising:
   determining whether a verification status resulting from ignoring a primary specific number of bits for all of data write-in loops is a pass status;
   determining whether a verification status resulting from ignoring a secondary specific number of bits greater than the primary specific number of bits for all of the data write-in loops is a pass status;
   stopping a data write-in operation when the verification status resulting from ignoring the primary specific number of bits for all of the data write-in loops is a fail status;
   determining whether the write-in voltage is equal to or less than a specified value of a write-in start voltage plus an arbitrary voltage;
   determining whether the verification status resulting from ignoring the primary specific number of bits is a pass status when the write-in voltage is equal to or less than that specified value;
   determining whether the verification status resulting from ignoring the secondary specific number of bits greater than the primary specific number of bits is a pass status when the write-in voltage is greater than that specified value;
   determining whether the write-in voltage is less than the maximum value when the verification status resulting from ignoring the secondary specific number of bits is a fail status; and
   determining the status as a fail status when the write-in voltage is equal to the maximum value;
   wherein program verification, where the primary specific number of bits is ignored, is carried out at the beginning of a data write-in operation until that specified value is reached; and
   program verification, where the secondary specific number of bits is ignored, is carried out when the write-in voltage falls between that specified value and the maximum value.

10. A data write-in method for a nonvolatile memory comprising:
   determining whether a verification status resulting from ignoring a primary specific number of bits for all of data write-in loops is a pass status;
   determining whether a verification status resulting from ignoring a secondary specific number of bits greater than the primary specific number of bits for all of the data write-in loops is a pass status;
   stopping a data write-in operation when the verification status resulting from ignoring the primary specific number of bits for all of the data write-in loops is a fail status;
   determining whether the write-in voltage is equal to or less than an upper limit value;
   determining whether the verification status resulting from ignoring the primary specific number of bits is a pass status when the write-in voltage is equal to or less than the upper limit value;
   determining whether the verification status resulting from ignoring the secondary specific number of bits greater than the primary specific number of bits is a pass status when the write-in voltage is greater than the upper limit value;
   determining whether the write-in voltage is less than the maximum value when the verification status resulting from ignoring the secondary specific number of bits is a fail status; and
   determining the status as a fail status when the write-in voltage is equal to the maximum value;
   wherein the upper limit value is used as a fixed parameter, and program verification, where the primary specific number of bits is ignored, is carried out from the start of data write-in to the upper limit value; and
   program verification, where the secondary specific number of bits is ignored, is carried out from the upper limit value to the maximum value.

11. A memory card, comprising:
   a nonvolatile semiconductor memory comprising:
      a memory cell array comprising a plurality of memory cells;
      a page buffer connected to the memory cell array and which retains program verification results of a write-in operation of repeating data write-in and program verification;
      a bit scan circuit connected to the page buffer and which determines whether the number of fail bits is equal to or less than number of reference bits, based on the program verification results retained in the page buffer;
      a register connected to the bit scan circuit and which retains determination results of the bit scan circuit; and
      a sequencer that controls the write-in operation and an operating sequence of the bit scan circuit, and which terminates the write-in operation while leaving the number of fail bits, in response to the results, temporarily stored in the register; and a memory controller comprising:
      a host interface connected to the nonvolatile semiconductor memory and a host apparatus; the host interface receives data from the host apparatus;
      a memory interface connected to the nonvolatile semiconductor memory and which transmits write-in data to the nonvolatile semiconductor memory;
      a central processing unit, which writes the received data as write-in data in the nonvolatile semiconductor memory via the memory interface; and
      an ECC circuit connected between the host interface and the memory interface, receives the received data, and carries out error correction.

12. The memory card of claim 11, wherein the sequencer changes the number of reference bits from the primary specific number of bits to the secondary specific number of bits in the write-in operation.

13. The memory card of claim 11, wherein the memory cells are configured to store at least ternary multi-valued logic data.

14. The memory card of claim 12, wherein the memory cells are configured to store at least ternary multi-valued logic data.

15. The memory card of claim 12, wherein the primary specific number of bits is less than the secondary specific number of bits.

16. The memory card of claim 12, wherein the primary specific number of bits and the secondary specific number of bits is less than an ECC tolerable number, respectively.

17. The memory card of claim 16, wherein the secondary specific number of bits is less than an ECC tolerable value.

* * * * *